United States Patent
Krishnamurthy et al.

(10) Patent No.: US 6,225,826 B1
(45) Date of Patent: May 1, 2001

(54) SINGLE ENDED DOMINO COMPATIBLE DUAL FUNCTION GENERATOR CIRCUITS

(75) Inventors: Ram K. Krishnamurthy; Krishnamurthy Soumyanath, both of Portland, OR (US); Mark A. Anders, Champaign, IL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/220,816

(22) Filed: Dec. 23, 1998

(51) Int. Cl.[7] .............................................. H03K 19/096
(52) U.S. Cl. ................................ 326/93; 326/95; 326/83
(58) Field of Search ................................. 326/93, 95, 98, 326/113, 83

(56) References Cited

U.S. PATENT DOCUMENTS

| | | |
|---|---|---|
| 4,616,148 | 10/1986 | Ochii et al. . |
| 4,885,479 | 12/1989 | Oritani . |
| 5,034,623 | 7/1991 | McAdams . |
| 5,086,427 | 2/1992 | Whittaker et al. .................. 370/85.1 |
| 5,291,076 * | 3/1994 | Bridges et al. ........................ 326/52 |
| 5,461,338 | 10/1995 | Hirayama et al. . |
| 5,483,181 | 1/1996 | D'Souza . |
| 5,559,461 | 9/1996 | Yamashina et al. ................. 327/305 |
| 5,568,062 | 10/1996 | Kaplinsky . |
| 5,572,151 * | 11/1996 | Hanawa et al. ...................... 326/113 |
| 5,594,361 | 1/1997 | Campbell ............................... 326/24 |
| 5,644,255 | 7/1997 | Taylor .................................... 326/81 |
| 5,814,899 | 9/1998 | Okumura et al. . |
| 5,852,373 | 12/1998 | Chu et al. . |
| 5,892,372 | 4/1999 | Ciraula et al. . |
| 5,903,169 * | 5/1999 | Kong ...................................... 326/95 |
| 5,986,473 | 11/1999 | Krishnamurthy et al. ............ 326/83 |
| 5,994,918 | 11/1999 | Mehra .................................... 326/30 |
| 6,002,292 | 12/1999 | Allen et al. . |
| 6,046,606 * | 4/2000 | Chu et al. ............................. 326/95 |

OTHER PUBLICATIONS

P. Larsson et al., "Noise in Digital Dynamic CMOS Circuits," IEE Journal of Solid–State Circuits, vol. 29, No. 6, Jun. 1994, pp. 655–662.

K. Shepard et al., "Noise in Deep Submicron Digital Design," ICCAD '96, pp. 524–531, 1996.

S. Shigematsu et al., "A 1–V High–Speed MTCMOS Circuit Scheme for Power–Down Application Circuits," IEEE Journal of Solid–State Circuits, vol. 32, No. 6, Jun. 1997, pp. 861–869.

(List continued on next page.)

Primary Examiner—Michael Tokar
Assistant Examiner—Daniel D. Chang
(74) Attorney, Agent, or Firm—Alan K. Aldous

(57) ABSTRACT

In some embodiments, the invention includes a domino logic gate circuit having a domino state and a single ended domino compatible dual function generator. The domino state receives a domino stage input signal and provides a single ended intermediate signal as a function of the domino stage input signal, the intermediate signal having a state. The generator receives the intermediate signal and provides an out signal and an out* signal each having a state, wherein the out and out* signals have the same state during a precharge phase and have complementary states during an evaluate phase as a function of the state of the intermediate signal. In other embodiments, the invention includes domino logic gate circuit having a combined domino stage and dual function generator. The domino stage is to receive a domino stage input signal. The dual function generator is a single ended domino compatible dual function generator to provide an out signal and an out* signal that each have a state and during a precharge phase, the out signal and out* signal each have the same state, and during an evaluate phase the out and out* states are complementary states as a function of the domino stage input signal without a logic X circuit and a logic X* circuit.

21 Claims, 13 Drawing Sheets

OTHER PUBLICATIONS

Z. Wang et al., "Fast Adders Using Enhanced Multiple–Output Domino Logic," IEEE Journal of Solid–State Circuits, vol. 32, No. 2, Feb. 1997, pp. 206–214.

Y. Nakagome et al., Sub–1–V Swing Internal Bus Architecture for Future Low–Power ULSI's IEEE Journal of Solid–State Circuits, vol. 28, No. 4, Apr. 1993, pp. 414–419.

H. Zhang et al., "Low–Swing Interconnect Interface Circuits," Proceedings of Int'l Symp. On Low Power Electronics and Design, Aug. 10, 1998, pp. 161–166.

N. Weste et al., "Principles of CMOS VLSI Design" (Addison–Wesley 2nd Edition, 1993). pp. 308–311.

T. Sakurai et al., "Low–Power CMOS Design through Vth Control and Low–Swing Circuits" Proceedings of Int'l Symp. On Low Power Electronics and Design, Aug. 18, 1997, pp. 1–6.

* cited by examiner

SINGLE ENDED DOMINO COMPATIBLE DUAL FUNCTION GENERATOR CIRCUITS

BACKGROUND OF THE INVENTION

1. Technical Field of the Invention

The present invention relates to circuits and more particularly, to a single ended domino compatible dual function generator circuit.

2. Background Art

Domino circuits often require true and complementary data inputs signals to implement Boolean logic functions. While an inversion of the previous domino stage's output may suffice logically, it leads to functional race conditions. Specifically, a domino gate typically requires both its true and complementary inputs to have the same state (e.g., a logic low state) during the precharge phase. This requirement is violated if a simple inverter is placed at the output of the domino stage. To solve this problem, a fully dual-rail implementation (including true and complementary versions of the domino stage) is used.

For example, referring to FIG. 1, a prior art domino logic gate circuit 10 provides signals OUT and OUT* on conductors 14 and 16 as a function of an input signal A1 . . . An, where OUT and OUT* both have a logic low state during a precharge phase and are complementary during an evaluate phase. OUT and OUT* may be inputs to a next domino stage. Circuit 10 includes a domino stage 18 and a domino stage 20 and static stages 24 and 26. In the particular prior art embodiment illustrated, static stages 24 and 26 are inverters. In this disclosure, signals on conductors 28 and 30 are called domino stage intermediate signals (or INT). There are referred to as intermediate because they are not ready for the next domino stage because they have a logic high state rather than a logic low state in the precharge phase. Inverters 24 and 26 provide signals OUT and OUT* are conductors 14 and 16, respectively. In the example of circuit 10, the function of domino stage 18 is a NOR function, the result of which is inverted by inverter 24 to produce an OR function (i.e., where OUT is the logical OR of inputs A1 . . . An). The function of domino stage 20 is an OR function, the result of which is inverter by inverter 26 to produce a NOR function (i.e., OUT* is the complement of the logical OR of inputs A1 . . . An).

A disadvantage of circuit 10 is that it requires both a domino stage and a complementary domino stage, leading to approximately twice the area and power consumption.

Another disadvantage of circuit 10 is that complementary domino stage 20 includes stacked transistors which can cause significant delay in switching states.

SUMMARY

In some embodiments, the invention includes a domino logic gate circuit having a domino state and a single ended domino compatible dual function generator. The domino state receives a domino stage input signal and provides a single ended intermediate signal as a function of the domino stage input signal, the intermediate signal having a state. The generator receives the intermediate signal and provides an out signal and an out* signal each having a state, wherein the out and out* signals have the same state during a precharge phase and have complementary states during an evaluate phase as a function of the state of the intermediate signal.

In other embodiments, the invention includes domino logic gate circuit having a combined domino stage and dual function generator. The domino stage is to receive a domino stage input signal. The dual function generator is a single ended domino compatible dual function generator to provide an out signal and an out* signal that each have a state and during a precharge phase, the out signal and out* signal each have the same state, and during an evaluate phase the out and out* states are complementary states as a function of the domino stage input signal without a logic X circuit and a logic X* circuit.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 1:
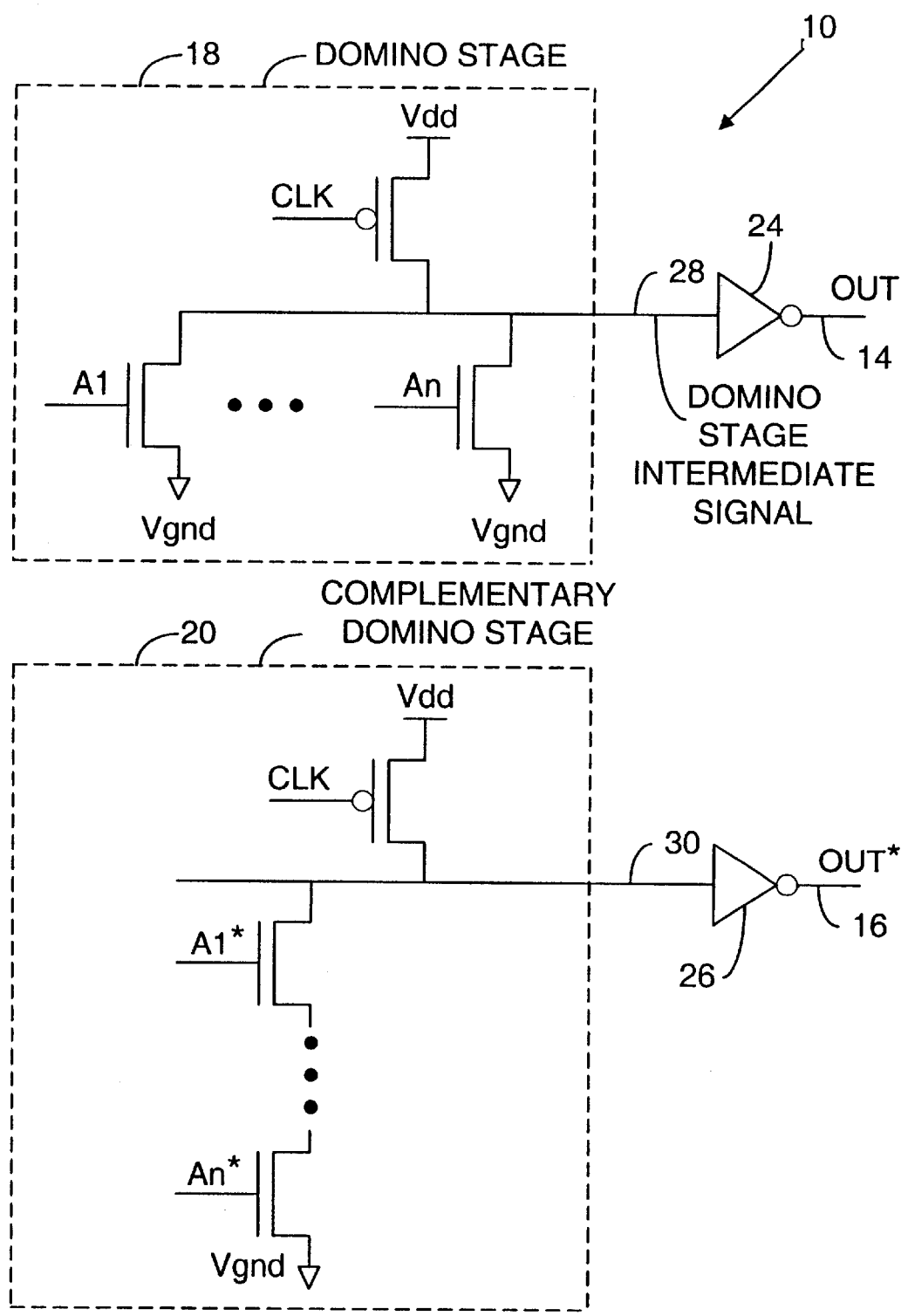
FIG. 1 is a schematic block diagram representation of a prior art logic gate circuit including a domino stage and inventor and a complementary domino stage and inverter to produce OUT and OUT* signals.
Figure 2A:
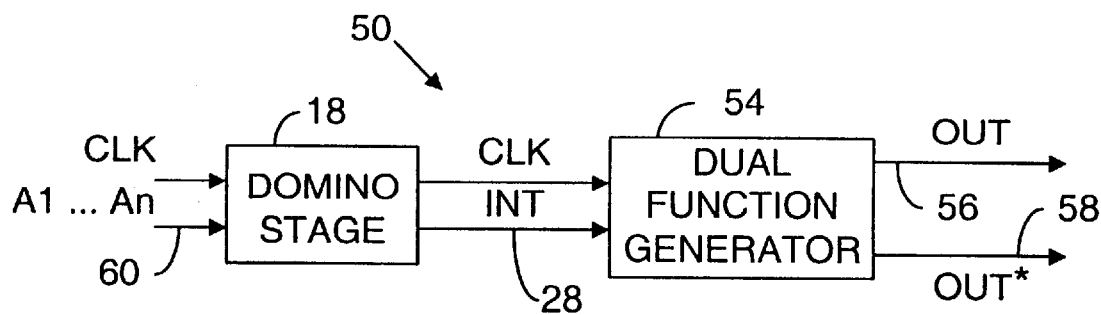
FIG. 2A is a schematic block diagram representation of a logic gate circuit including a single ended domino compatible dual function generator circuit according to some embodiments of the invention which receives an intermediate signal from a single domino stage.

Referring to FIG. 2A, in contrast to the prior art circuit 10 of FIG. 1, some embodiments of the present invention include a logic gate circuit 50 including a domino stage 18 and a single ended domino compatible dual function generator circuit 54 (hereinafter "DFG 54"). In FIG. 2A, domino stage 18 is representative of a wide variety of domino stages that receives a domino stage input signal A1 . . . An on conductor(s) 60. The input signal may include a single bit A. A clock signal (CLK) is received by both domino stage 18 and DFG 54. CLK may be delayed between being received by domino stage 18 and being received by DFG 54.

DFG 54 is referred to as being a single ended generator because its input signal INT on conductor 28 is a single ended signal as opposed to being differential signals which are used for noise rejection. For example, DFG 54 receives a signal INT on conductor 28 from a single domino stage 18 rather than from two domino stages in differential form. The input signal INT on conductor 28 may be referred to as a domino stage intermediate signal or merely an intermediate signal.

DFG circuit 54 is domino compatible in that its output signals OUT and OUT* on conductors 56 and 58 have the same logic state during a precharge phase. In the following discussion, OUT and OUT* each have a logic low state (hereinafter "low") during the precharge phase. However, the various circuits illustrated herein easily could be changed so that OUT and OUT* each have a logic high state (hereinafter "high") during precharge. During an evaluate phase, OUT and OUT* are a function of the input signal INT on conductor 28 and indirectly a function of the states of the domino stage input signal A1 . . . An on conductor(s) 60 of domino stage 18. In the evaluate phase, OUT and OUT* are complements so that one is low and the other is high.

Figure 2B:
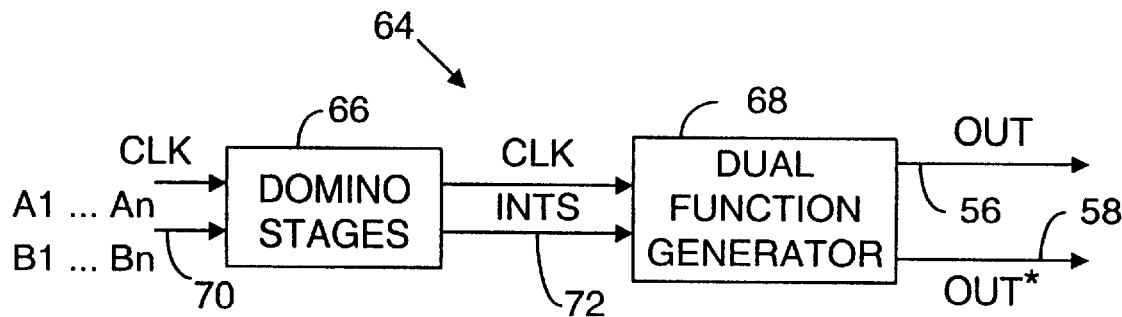
FIG. 2B is a schematic block diagram representation of a logic gate circuit including a single ended domino compatible dual function generator circuit according to some embodiments of the invention which receives an intermediate signal from multiple domino stages.

FIG. 2B illustrates a logic gate circuit 64 in which a single ended domino compatible dual function generator circuit 68 (DFG 68) receives intermediate signals (INTS) on conductors 72 from multiple domino stages 66. One of the domino stages receives a domino stage input signal A1 . . . An, while another one of the domino stages receives a domino stage input signal B1 . . . Bn, etc, on conductors 70. Input signal A1 . . . An may include only a single bit A, and input signal B1 . . . Bn may include only a single bit B, etc. OUT and OUT* have the same state in precharge and are complements during an evaluate phase as a function of signals INTS.

Because DFG 54 and DFG 68 respond to a CLK signal, they may be deemed to be dynamic in contrast to the static stages of the prior art.

Figure 3:
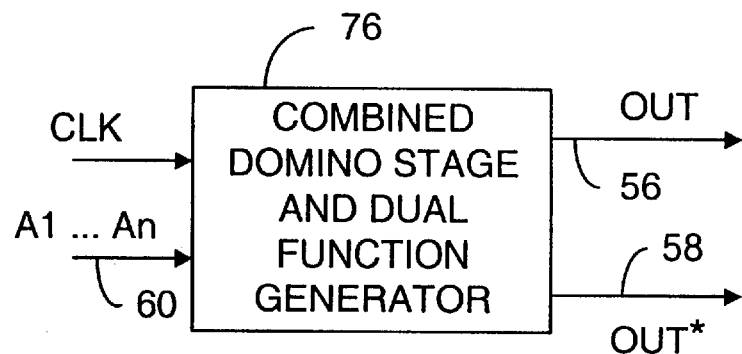
FIG. 3 is schematic block diagram representation of a combined domino stage and dual function generator circuit, which includes a single ended domino compatible dual function generator circuit according to some embodiments of the invention.

FIG. 3 illustrates a combined domino stage and dual function generator circuit 76 (hereinafter "Combined DFG 76"). Combined DFG 76 includes a single ended domino compatible dual function generator in that OUT and OUT* have the same state in a precharge phase and complementary states in an evaluate phase as a function of signals A1 . . . An. Combined DFG 76 may perform a single domino function (like domino stage 18 in FIG. 2A) or multiple domino functions (like domino stages 66 in FIG. 2B), in which case A1 . . . An in FIG. 3 represents A1 . . . An and B1 . . . Bn, etc., in FIG. 2B.

Note that in FIGS. 2A, 2B, and 3, some of A1 . . . An may be complements; in FIGS. 2B, some of B1 . . . Bn, etc, may be complements, and some of signals INT may be complements. However, DFG 54, DFG 68, and Combined DFG 76 are still each single ended because the complements are coincidental and are not required or designed in for operation. Any such complements are not treated as differential signals for noise rejection.

A. Example of DFG 54

Figure 4:
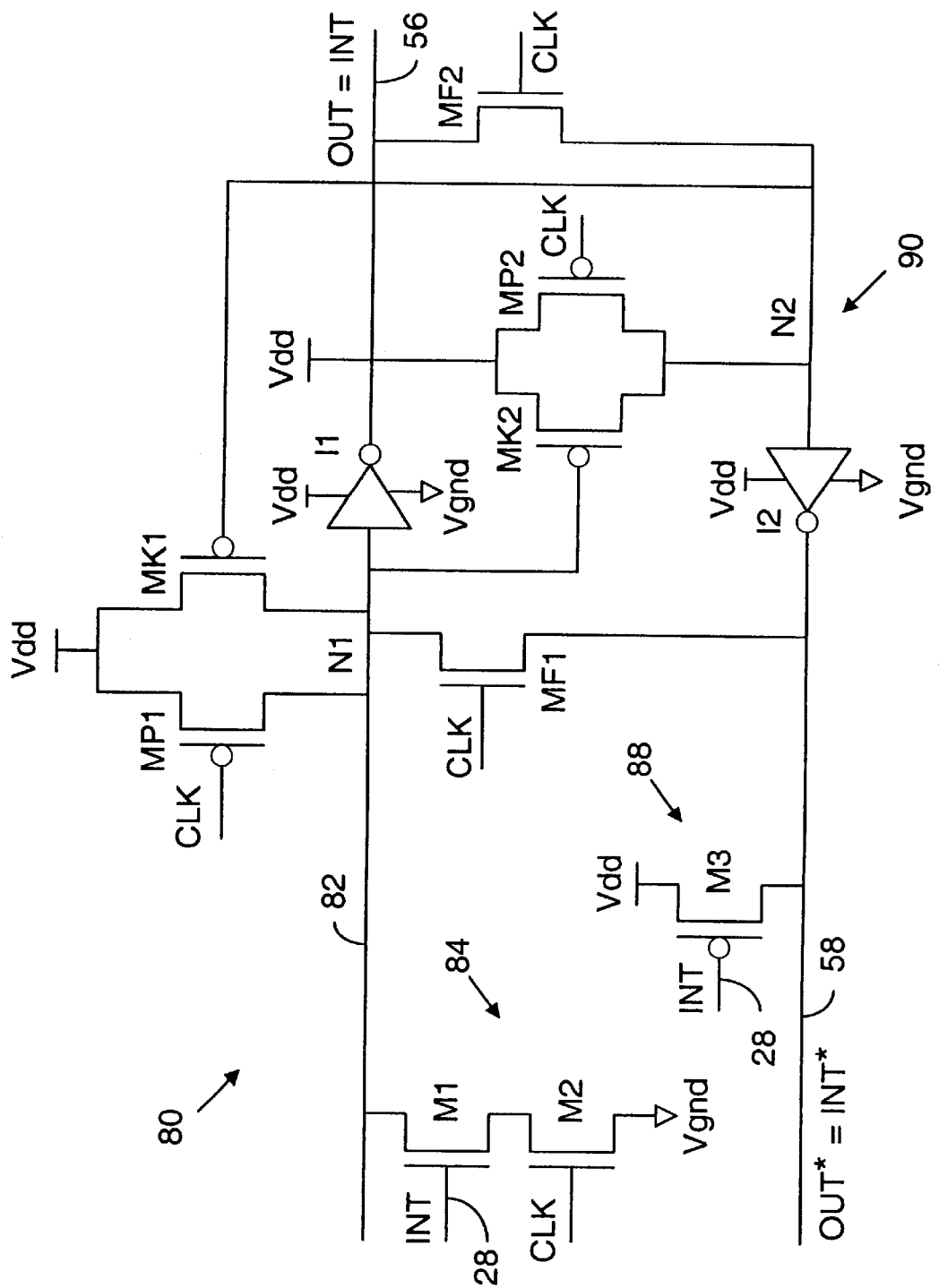
FIG. 4 is a schematic representation of an example of the signal ended domino compatible dual function generator circuit of FIG. 2A.

FIG. 4 illustrates a signal ended domino compatible dual function generator circuit 80 (hereinafter DFG 80), which is an example of DFG 54 in FIG. 2A. DFG 80 provides output signals OUT and OUT* on conductors 56 and 58. During the precharge phase, OUT and OUT* are low. During the evaluate phase, OUT and OUT* are complementary and a function of the state of the input signal (INT) on conductor 28. DFG 80 performs buffer/inverter functions such that during the evaluate phase, OUT has the logical state of INT and OUT* has the logical state of INT*.

DFG 80 includes a function X circuit 84, including n-channel field effect transistors (nFET transistors) M1 and M2, coupled to conductor 82. A function X* circuit 88, including a p-channel field effect transistor (pFET transistor) 88, is coupled to conductor 58. Precharge pFET transistor MP1 is also coupled to conductor 82. During precharge, the clock signal CLK is low and INT is high. Accordingly, transistors M2 and M3 are off and a node N1 is high through transistor MP1. Accordingly, OUT is low on conductor 56 because of inverter I1. A node N2 is high through a precharge pFET transistor MP2. Accordingly, OUT* is low on conductor 58 because of inverter I2.

Figure 5:
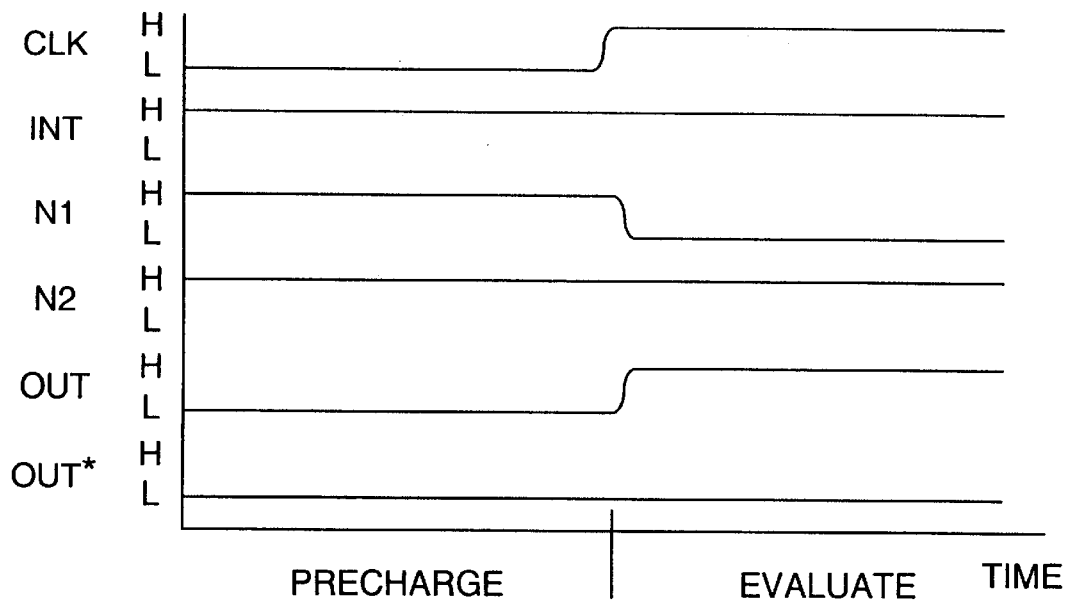
FIG. 5 is a timing diagram that shows the state of certain signals of FIG. 4 in precharge and evaluation stages in the case in which an input signal INT does not change state.
Figure 6:
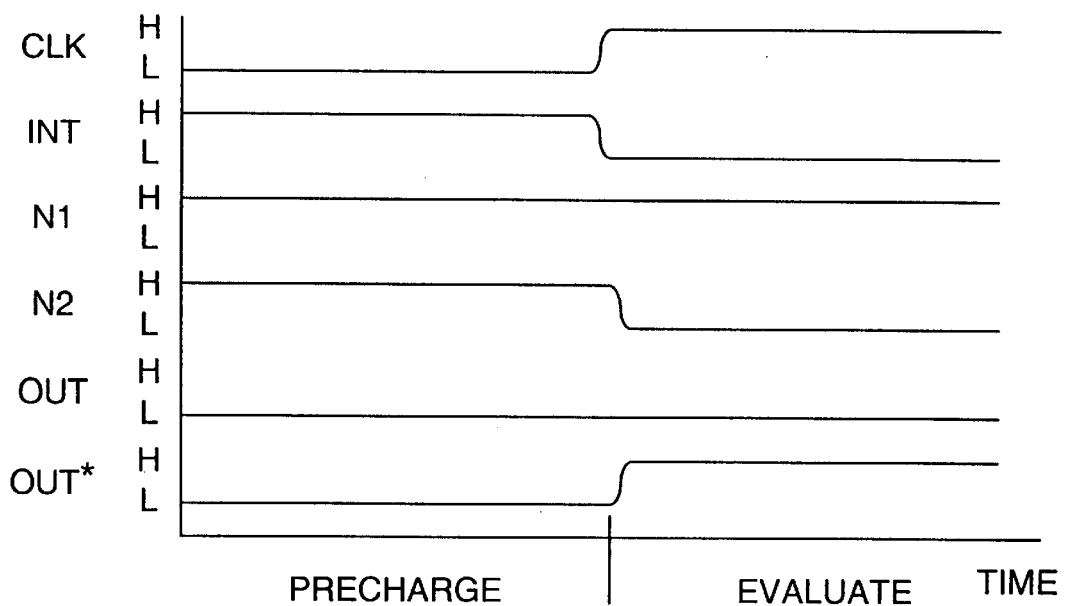
FIG. 6 is a timing diagram that shows the state of certain signals in precharge and evaluate stages in the case in which an input signal INT changes state.

During the evaluate phase, CLK is high and the operation of DFG 80 depends on the state of input signal INT from the domino stage. INT conditionally switches to low in the evaluate phase. FIGS. 5 and 6 are timing diagrams illustrating general relationships of the signals. FIGS. 5 and 6 are not intended to be precise diagrams. For example, the timing relationship of transitions of the CLK and INT signals can be adjusted to effect performance. In evaluate phase, MP1 and MP2 are turned off. FIG. 4 illustrates the case in which INT stays high during evaluate. In that case, referring to FIGS. 4 and 5, with CLK and INT high, transistors M1 and M2 are on and M3 is off so that node N1 is pulled low and OUT* remains low. As N1 is pulled low, OUT is pulled high through inverter I1 and keeper transistor MK2 is turned on keeping node N2 high. Further, feedback transistors MF1 and MF2 are turned on creating a positive feedback loop 90 including inverters I1 and I1 and transistors MF1 and MF2. With MF2 on, node OUT is also pulled high by N2. With node N2 high, OUT* remains low. With MF1 on, node N1 is further kept low through OUT*. Loop 90 is an intermittent feedback loop which is intermittently enabled. Loop 90 is enabled in the evaluate phase when MF1 and MF2 are on. Loop 90 is disabled in the precharge phase.

If INT goes low during evaluate (as in FIG. 6), M1 is off and M3 is on, pulling OUT* high. Node N1 is pulled high through MF1. As N1 is pulled high, OUT is pulled low through inverter I1. With OUT low, node N2 is pulled low through MF2 and inverter I2 pulls or keeps OUT* high along with M3. With N2 low, keeper transistor MK1 is turned on keeping N1 high.

Feedback loop 90 may enhance the performance of DFG 54 in two ways. First, feedback loop 90 may increase the speed of switching states of OUT or OUT* by having one of them pulled up through multiple transistors. However, the extent of the increase may depend on the timing of INT and CLK and the sizes of the various transistors. For example, in the case when INT is low during evaluate stage, depending on the timing of INT and CLK and the sizes of the transistors, it may be that M3 has done essentially all of the work of pulling up node OUT* before inverter I2 begins pulling up.

Second, feedback loop 90 may increase noise immunity through hysteresis so that noise on N1 and N2 tends to be rejected through inverters I1 and I2. With hysteresis, noise must be greater to cause a change of state.

B. Examples of DFG 68

Figure 7:
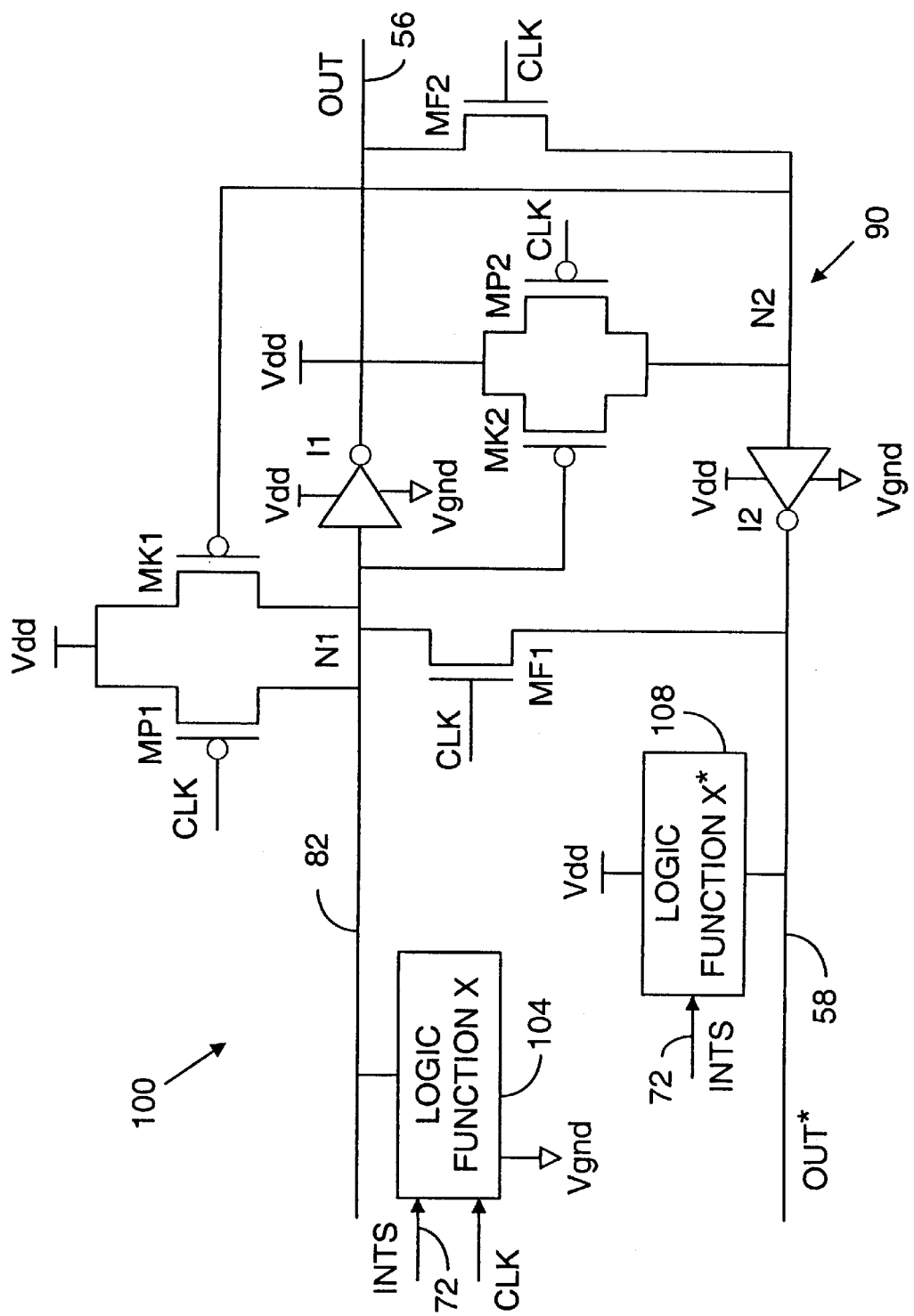
FIG. 7 is a schematic representation of an example of the single ended domino compatible dual function generator circuit of FIG. 2B.

FIG. 7 illustrates a signal ended domino compatible dual function generator circuit 100 (hereinafter DFG 100), which is an example of DFG 68 in FIG. 2B. DFG 100 provides that output signals OUT and OUT* on conductors 56 and 58. During the precharge phase, OUT and OUT* are low. During the evaluate phase, OUT and OUT* are complementary and a function of the state of the input signals (INTS) on conductors 72. DFG 100 acts like DFG 80 except that different INT signals may be required for node N1 or OUT* to be low or high during the evaluate phase.

Figure 8:
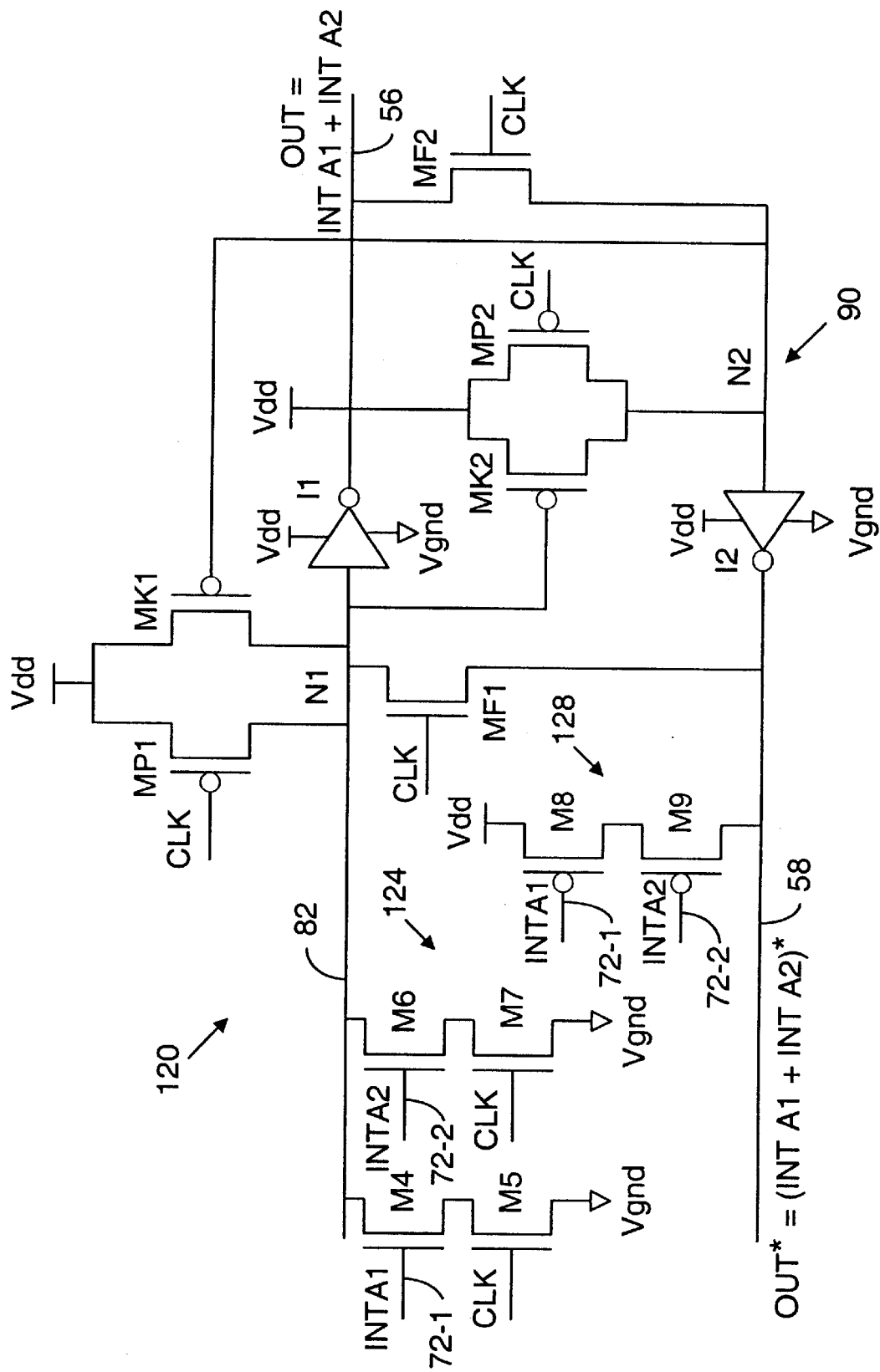
FIG. 8 is a schematic representation of an example of the single ended domino compatible dual function generator circuit of FIG. 2B.

FIG. 8 illustrates a signal ended domino compatible dual function generator circuit 120 (hereinafter DFG 120), which is an example of DFG 68 and DFG 100 in FIGS. 2B and 7. DFG provides OR/NOR functions, where in evaluate phase, OUT is the logical OR of inputs INTA1 and INTMA2 and OUT* is the logical NOR of INTA1 and INTA2. In DFG 100, a circuit 124 is a logic function X circuit including transistors M4, M5, M6, and M7 and a circuit 128 is a logic function X* circuit including transistors M8 and M9. Transistors M4 and M8 receive signal INTA1 on conductors 72-1. Transistors M6 and M9 receive signal INTA2 on conductor 72-2. DFG 120 operates like DFG 80 except that during evaluate phase, the states of OUT and OUT* are dependent on two INT signals.

Figure 9:
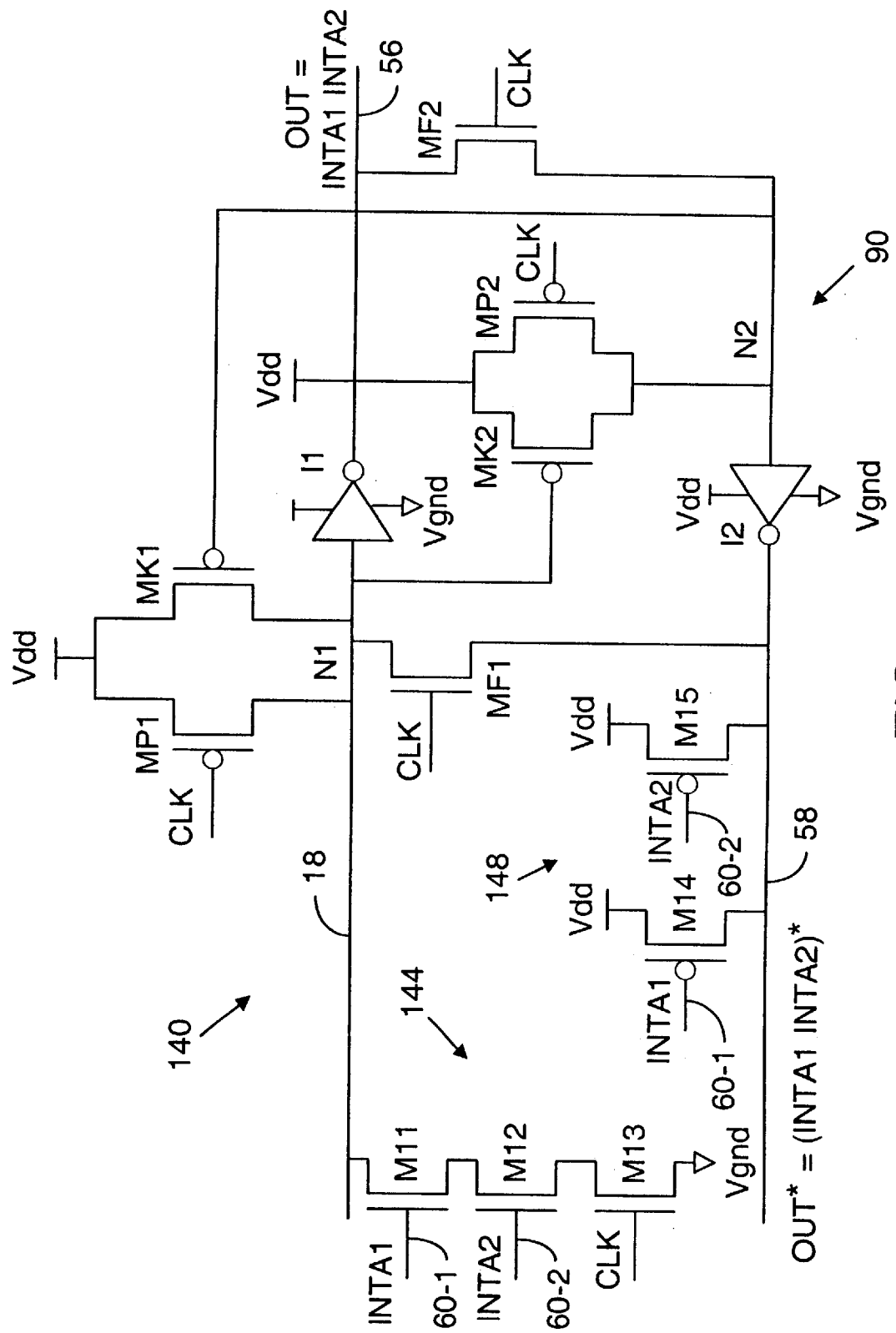
FIG. 9 is a schematic representation of an example of the single ended domino compatible dual function generator circuit of FIG. 2B.

FIG. 9 illustrates a signal ended domino compatible dual function generator circuit 140 (hereinafter DFG 140), which is an example of DFG 68 and DFG 100 in FIGS. 2B and 7. DFG 140 provides AND/NAND functions, where in the evaluate phase, OUT is the logical AND of inputs INTA1 and INTA2 and OUT* is the logical NAND of INTA1 and INTA2. DFG 120 operates like DFG 80 except that during evaluate phase, the states of OUT and OUT* are dependent on two INT signals.

Logic function X and X* circuits may include more complicated logic than illustrated in FIGS. 8 and 9.

C. Examples of Combined DFG 76

As mentioned, stacked transistors in domino stages may lead to delay. FIGS. 10–14 illustrates combined domino stage and dual function generator circuits that do not include stacked transistors in the domino stage. The circuits of FIGS. 10–14 are domino gate circuits that include a domino stage, but eliminate the logic function X circuit and logic function X* circuit of DFGs 80, 100, 120, and 140. Accordingly, the delay of these logic function X and X* circuits is eliminated.

Figure 10:
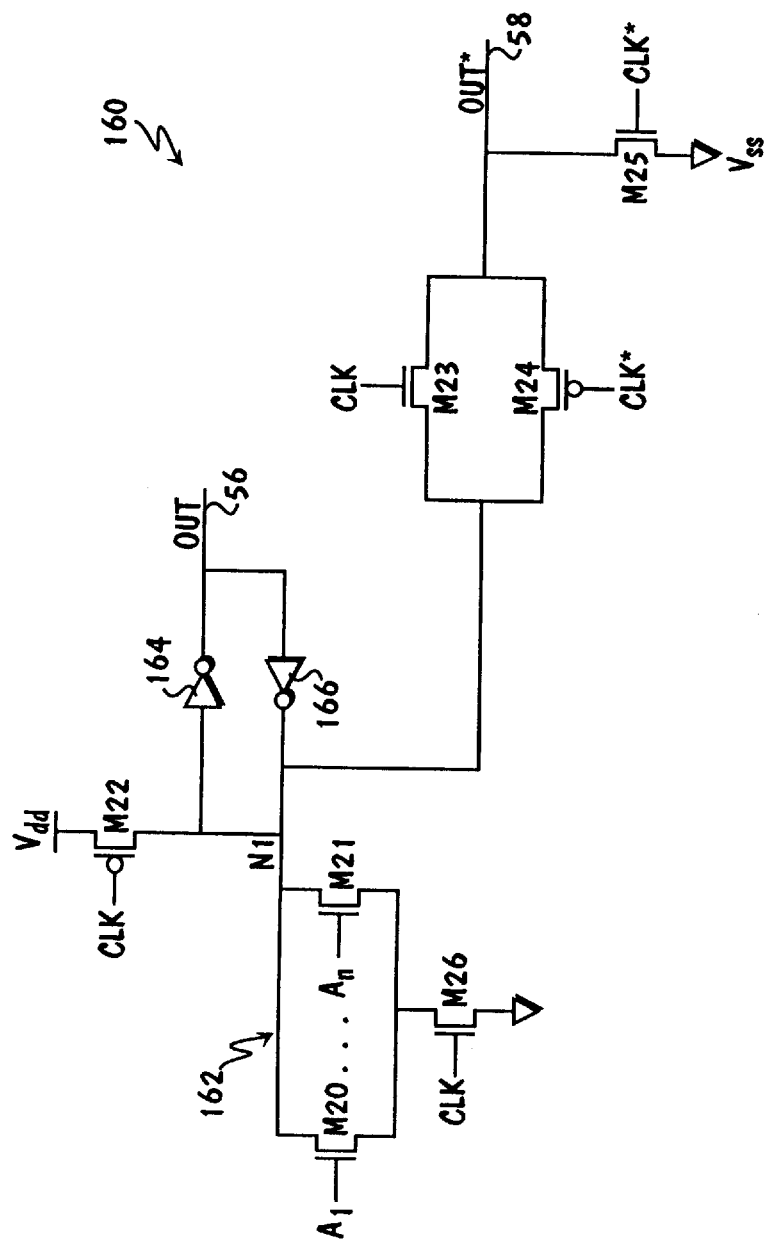
FIG. 10 is a schematic representation of an example of the combined domino stage and dual function generator circuit of FIG. 3.

Referring to FIG. 10, a combined domino stage and dual function generator circuit 160 (hereinafter Combined DFG 160) is an example of Combined DFG 76 of FIG. 3. Combined DFG 160 includes a domino stage 162 including a series of parallel nFET transistors (represented by M20 and M21) that receive domino stage inputs A1 . . . An. Domino stage 162 could include a single transistor and a single bit input signal A. (In some embodiments, the domino stage could include stacked transistors.) In the precharge phase when CLK is low, node N1 is high through a pFET transistor M22. With N1 high, the output signal OUT is low through an inverter 164. Cross-coupled inverters 164 and 166 form a positive feedback loop which provides hysteresis. Inverter 166 helps increase noise immunity, may increase switching speed, and acts as a keeper and perhaps booster for node N1. (Additional keeper transistor(s) may be included in Combined DFG 160.) With CLK low, pass transistors M23 and M24 are off and transistor M25 is on so that OUT* is low.

In the evaluate phase, CLK is high so that transistors M22 and M25 are off and transistors M23 and M24 are on. If any bit of input signal A1 . . . An is high, node N1 is pulled low through the corresponding transistor(s). With N1 low, OUT goes high and OUT* stays low. Inverter 166 keeps N1 low. Alternatively, if no bit of A1 . . . An is high, node N1 remains high and OUT remains low. Node N1 pulls OUT* high. Note that inverter 166 keeps node N1 high. Additional measures can be taken to increase noise immunity on conductor 58 (e.g., additional capacitance or a hysteresis loop), particularly when OUT* is low. The signal OUT* is selectively decoupled from node N1 and domino stack 162 through the transmission gate of M23 and M24.

Figure 11:
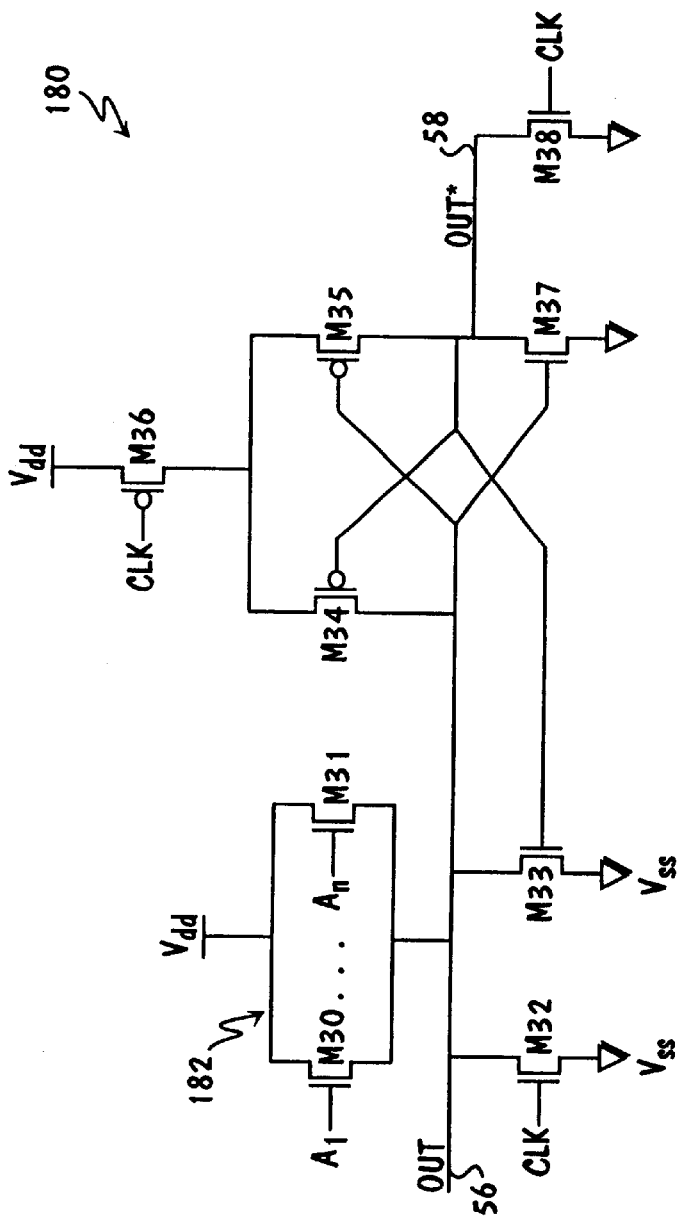
FIG. 11 is a schematic representation of an example of the combined domino stage and dual function generator circuit of FIG. 3.

Referring to FIG. 11, a combined domino stage and dual function generator circuit 180 (hereinafter Combined DFG 180) is an example of Combined DFG 76 of FIG. 3. Combined DFG 180 includes a source follower domino stage 182 including a series of parallel nFET transistors (represented by M30 and M31) that receive a domino stage input signal A1 . . . An. Domino stage 182 could include a single transistor and a single bit input signal A. (In some embodiments, the domino stage could include stacked transistors.) In the precharge phase when CLK is high, OUT is low through an nFET transistor M32 (a predischarge) and OUT* is low through an nFET transistor M38. Transistor M36 is off during the precharge phase. With OUT and OUT* low, transistors M34 and M35 are ready to turn on.

In the evaluate phase, CLK is low so that transistors M32 and M38 are off and transistor M36 turns on. Transistors M34 and M35 are in a cascode switching arrangement. With M36 on, transistors M34 and M35 try to pull OUT and OUT* high. If any of bits A1 . . . An is high, OUT is pulled high through the corresponding transistor(s). OUT is also pulled high through M34 and M36. With OUT high, M35 is turned off and a transistor M37 keeps OUT* low. As M35 become weaker, M34 becomes stronger. If none of bits A1 . . . An is high, OUT stays low. Transistor M35 pulls OUT* high which turns off M34. As OUT* becomes high, M33 is turned on which keeps OUT low, in turn keeping OUT* high and helping with noise immunity. Transistors M34 and M35 act as feedback transistors. As M35 gets stronger, M34 gets weaker and vice versa accelerating the transition of OUT or OUT*.

Figure 12:
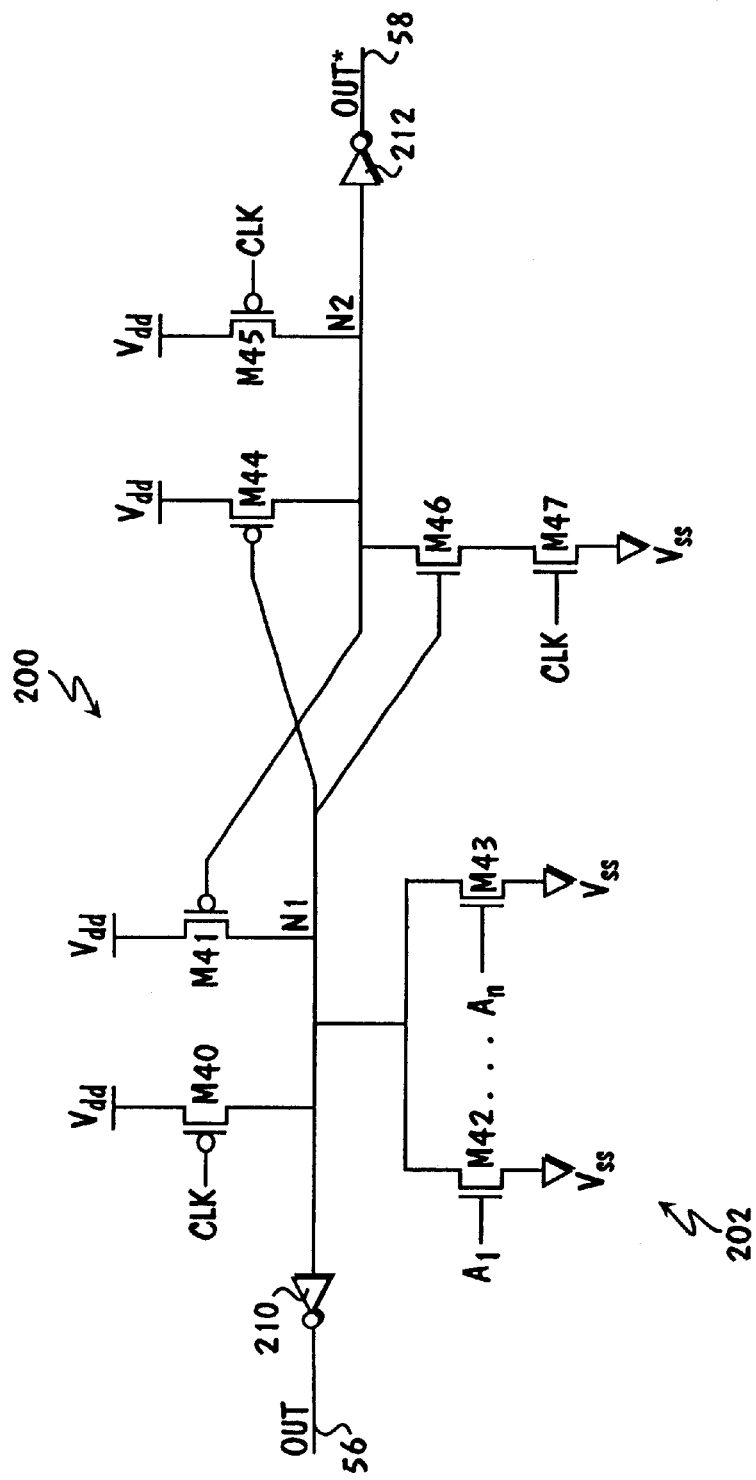
FIG. 12 is a schematic representation of an example of the combined domino stage and dual function generator circuit of FIG. 3.

Referring to FIG. 12, a combined domino stage and dual function generator circuit 200 (hereinafter Combined DFG 200) is an example of Combined DFG 76 of FIG. 3. Combined DFG 200 includes a domino stage 202 including a series of parallel nFET transistors (represented by M42 and M43) that receive a domino stage input signal A1 . . . An. Domino stage 202 could include a single transistor and a single bit input signal A. (In some embodiments, the domino stage could include stacked transistors.) In the precharge phase, when CLK is low, a node N1 is pulled high through a pFET transistor M40 and a node N2 is pulled high through a pFET transistor M45. With nodes N1 and N2 high, OUT and OUT* are low through inverters 210 and 212.

In the evaluate phase, CLK is high so that transistors M40 and M45 are off, but transistor M47 is on. If no bit of A1 .

. . An is high, node N1 remains high and node N2 is pulled low through transistors M46 and M47. With node N2 low, OUT* is pulled high through inverter 212. If any of A1 . . . An is high, node N1 is pulled low and M44 is turned on and N2 is pinned high. With node N1 low and N2 high, OUT is high and OUT* is low. Transistors M41 and M44 act as feedback transistors in a cascode switching arrangement where as M44 gets stronger, M41 gets weaker and vice versa accelerating the transition of OUT or OUT*.

Figure 13:
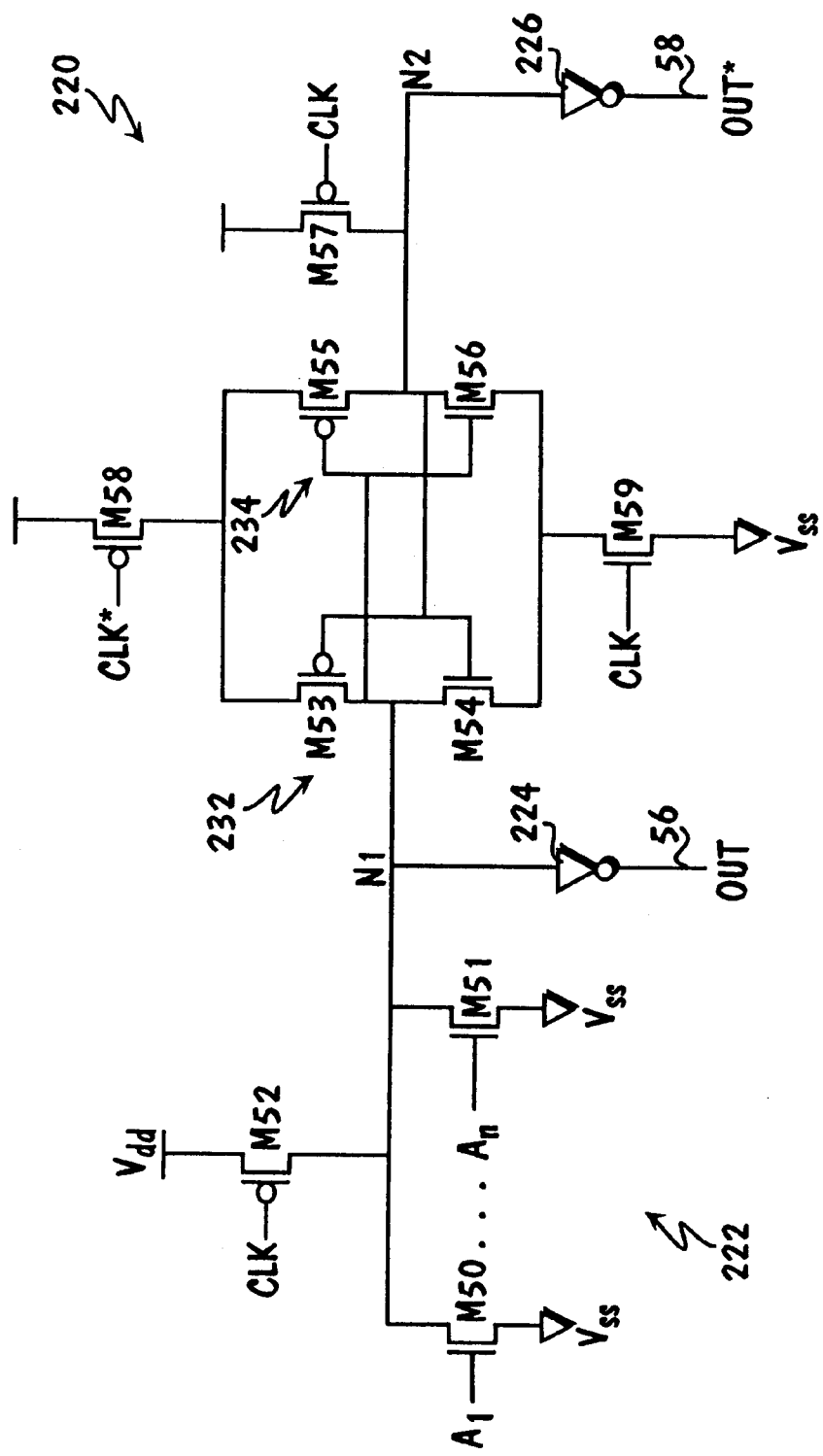
FIG. 13 is a schematic representation of an example of the combined domino stage and dual function generator circuit of FIG. 3.

Referring to FIG. 13, a combined domino stage and dual function generator circuit 220 (hereinafter Combined DFG 220) is an example of Combined DFG 76 of FIG. 3. Combined DFG 220 includes a domino stage 222 including a series of parallel nFET transistors (represented by M50 and M51) that receive a domino stage input signal A1 . . . An. Domino stage 222 could include a single transistor and a single bit input signal A. (In some embodiments, the domino stage could include stacked transistors.) In the precharge phase when CLK is low, a node N1 is high through a pFET transistor M52 and a node N2 is high through a pFET transistor M57. With nodes N1 and N2 high, OUT and OUT* are low through inverters 224 and 226. An inverter 232 includes transistors M53 and M54. An inverter 234 includes transistors M55 and M56. Inverters 232 and 234 are cross-coupled because the output of inverter 232 is applied to the input of inverter 234 and output of inverter 234 is applied to the input of inverter 232. During the precharge phase, transistors M58 and M59 are off so that inverters 232 and 234 are in a high impedance (tri-state) state.

In the evaluate phase, CLK is high so that transistors M52 and M57 are off, but transistors M58 and M59 is on and the cross-coupled inverters 232 and 234 are enabled. If any of bits A1 . . . An is high, node N1 goes low through the corresponding transistors(s) so that OUT is pulled high through inverter 224. With N1 low, node N2 stays pinned high through M55 and M58 and OUT* remains low. When N2 is high, M54 keeps N1 low. The transistors of inverters 232 and 234 are sized (skewed) such that inverter 234 is stronger than inverter 232. Accordingly, if none of bits A1 . . . An goes high, N1 stays high (so OUT stays low) and N2 is pulled low through M56 and M59 of inverter 234. When N2 is low, M53 pulls or keeps node N1 high.

Figure 14:
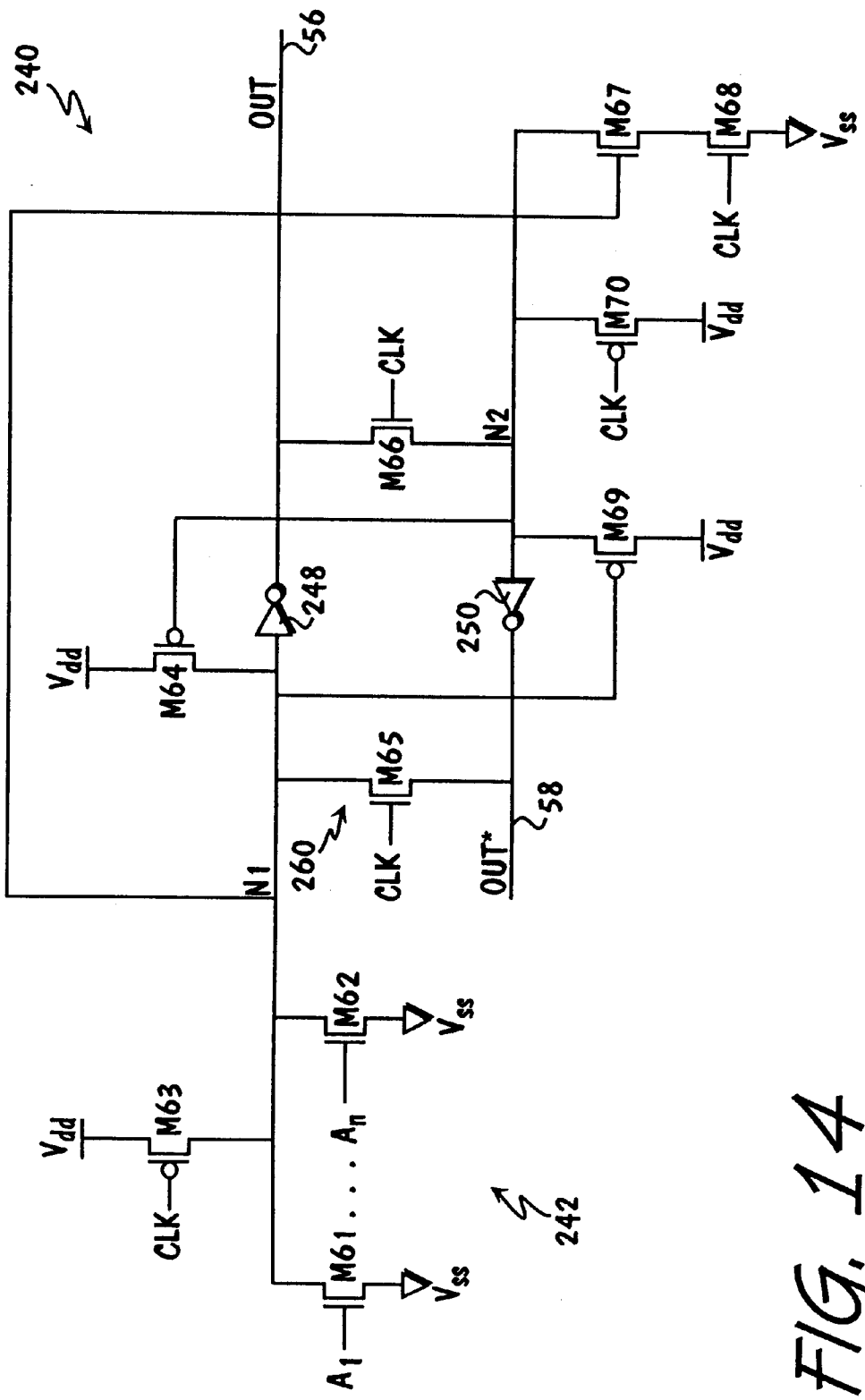
FIG. 14 is a schematic representation of an example of the combined domino stage and dual function generator circuit of FIG. 3.

Referring to FIG. 14, a combined domino stage and dual function generator circuit 240 (hereinafter Combined DFG 240) is an example of Combined DFG 76 of FIG. 3. Combined DFG 240 includes a domino stage 242 including a series of parallel nFET transistors (represented by M61 and M62) that receive a domino stage input signal A1 . . . An. Domino stage 242 could include a single transistor and a single bit input signal A. (In some embodiments, the domino stage could include stacked transistors.) In the precharge phase when CLK is low, a node N1 is pulled high through a pFET transistor M63. With node N1 high, OUT is low through inverter 248. A node N2 is high through pFET transistor M70. With node N2 high, OUT* is low through inverter 250.

An intermittent positive feedback loop 260 includes inverters 248 and 250 and nFET transistors M65 and M66. In the evaluate phase, with CLK high, M65 and M66 are on and loop 260 is enabled. If any of bits A1 . . . An is high, node N1 is pulled low. Accordingly, OUT is high through inverter 248. With M66 on, node N2 remains high. With N2 high, OUT* remains low. Out* is also pulled low through domino stage 242. If none of A1 . . . An is high, node N1 remains high and OUT remains low. With M66 on, node N2 is pulled low. Also, with node N1 high, transistor M67 is on which contributes to node N2 being pulled to ground. With N1 low, OUT* is pulled high through inverter 250. Further, OUT* is pulled high through feedback transistor M65. Feedback loop 260 increases noise immunity and may increase switching speed. Details of the noise immunity and speed depend on the size of the transistors and timing of the signals. Circuit 240 is in some ways similar to the combination of a domino stage 18 in FIG. 2A and DFG 80 in FIG. 4. However, circuit 240 includes transistors M67 and M68 and does not include logic X and X* circuits 84 and 88, which results in less delay in circuit 240.

In FIGS. 10–14, the signals at the node connected to the domino stage may be considered an intermediate signal.

D. Additional Information

Figure 15:
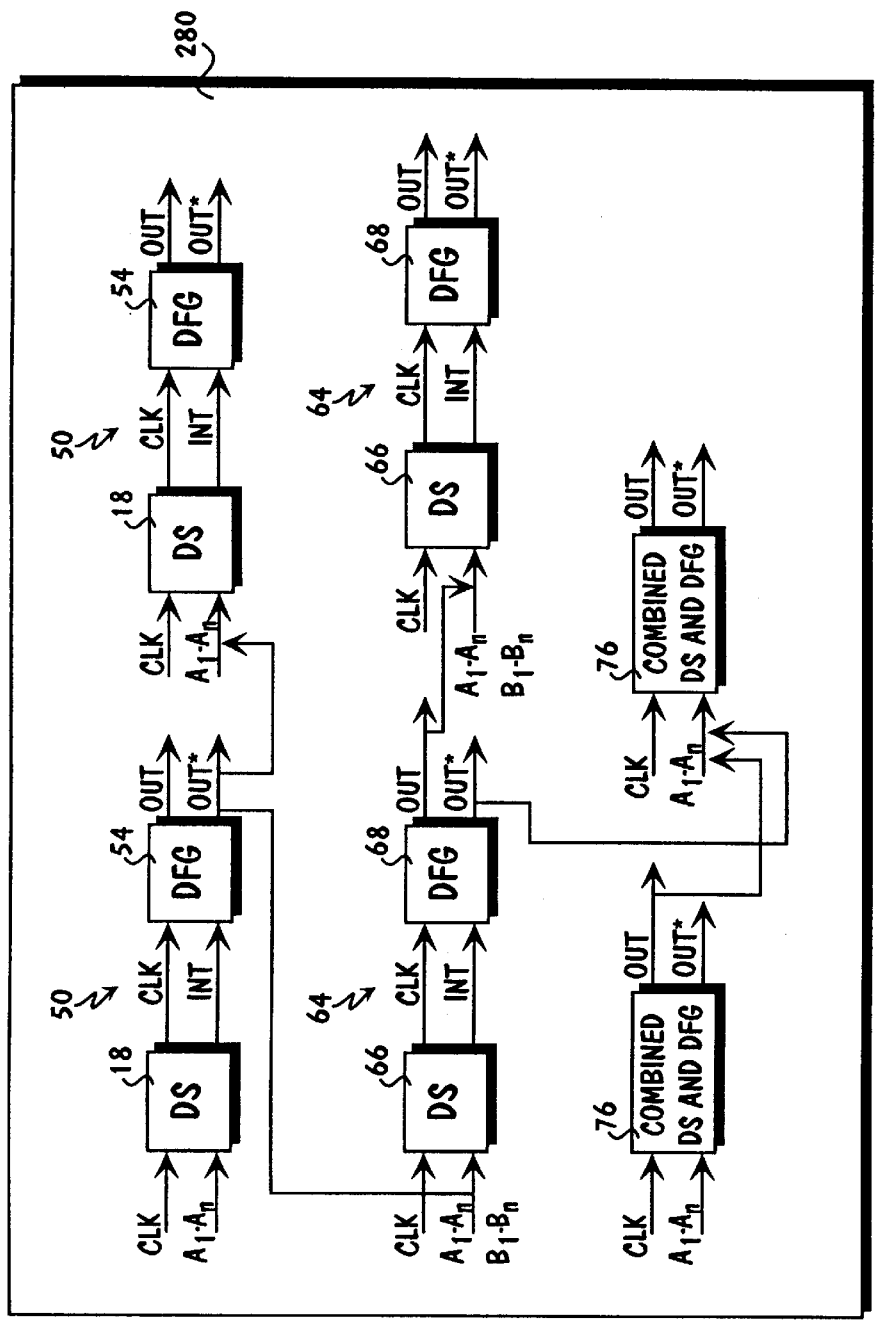
FIG. 15 is a block diagram representation of an integrated circuit including various of the logic gate circuits of FIGS. 2A, 2B, and 3.

Domino gates according to the present invention may be used in processors (including microprocessors and digital signal processors (DSPs)), chipset circuits, and a variety of other integrated circuits. Typically, OUT and/or OUT* of DFG 54, DFG 68, and Combined DFG 76 will be the inputs to other domino stages, but may be the inputs to other circuits. Typically, the input signal A1 . . . An will include the OUT and/or OUT* of another dual function generator, but may be otherwise. For example, FIG. 15 illustrates an integrated circuit 280, including various instances of circuits 50, 64, and 76, wherein the OUT and OUT* signals of some instances of circuits 50, 64, and 76 are included in the input signal bits to others of the instances of circuits 50, 64, and 76. Note that the different instances of A1 . . . An are not necessarily the same signals. Of course, there would be various other circuits (not shown) in integrated circuit 280 and the invention does not require the particular arrangement, which is merely exemplary that the output of one logic gate may be part of the input of another.

Although the illustrated embodiments include enhancement mode transistors, depletion mode transistors could be used.

There may be intermediate structure (such as a buffer) or signals between two illustrated structures or within a structure (such as a conductor) that is illustrated as being continuous. The borders of the boxes in the figures are for illustrative purposes and not intended to be restrictive.

If the specification states a component, feature, structure, or characteristic "may", "might", or "could" be included, that particular component, feature, structure, or characteristic is not required to be included. Reference in the specification to "some embodiments" means that a particular feature, structure, or characteristic described in connection with the embodiments is included in at least some embodiments, but not necessarily all embodiments, of the invention. The various appearances "some embodiments" are not necessarily all referring to the same embodiments.

Additional keeper transistors may be included in the various circuits, such as the circuits of FIGS. 10–14.

The circuits of FIGS. 10–14 are illustrated with only one domino stage, but could include more than one domino stage of which the OUT and OUT* may be functions.

The various embodiments have described CLK as being low or high during precharge, depending on the example. However, the logic could be changed so that CLK is in the opposite state during the precharge phase.

The various transistors may be sized as desired and the timing signals may be adjusted to achieve desired results.

The expression "state of the domino stage input signal" means the combination of the states of the bit(s) of the domino state input signal. For example, if there are two bits in the domino stage input signal, the state of the domino stage input signal might be 00, 01, 10, or 11. If the domino stage input signal has only one bit, then the state is the state of that one bit.

The transistors may be forward biased, zero biased, or reverse biased, and different transistors may have different biases.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A domino logic gate circuit, comprising:
    a domino stage to receive a domino stage input signal and provide a single ended intermediate signal as a function of the domino stage input signal, the intermediate signal having a state; and
    a single ended domino compatible dual function generator to receive the intermediate signal and provide an out signal and an out* signal each having a state, wherein the out and out* signals have the same state during a precharge phase and have complementary states during an evaluate phase as a function of the state of the intermediate signal and wherein the generator includes an intermittent positive feedback loop which is intermittently enabled.

2. The domino gate logic circuit of claim 1, wherein the generator includes a logic function X circuit and a logic function X* circuit.

3. The domino gate logic circuit of claim 1, wherein the positive feedback loop includes two inverters and conductors carrying the out and out* signals.

4. The domino gate logic circuit of claim 1, wherein the generator includes the intermittent positive feedback loop includes two inverters and conductors carrying the out and out* signals, that is enabled during the evaluate phase.

5. The domino gate logic circuit of claim 1, wherein the loop includes cross-coupled inverters.

6. The domino gate logic circuit of claim 1, wherein the out* signal is selectively decoupled from the domino stage.

7. The domino gate logic circuit of claim 1, wherein the generator includes transistors in a cascode switched arrangement leading to accelerate a state transition of the out signal or out* signal.

8. The domino gate logic circuit of claim 1, wherein the generator includes feedback transistors in a cascode switched arrangement.

9. The domino gate logic circuit of claim 1, wherein the generator includes skewed cross-coupled inverters.

10. A domino logic gate circuit, comprising:
    domino stages to receive a domino stage input signals and provide a single ended intermediate signals as functions of the domino stage input signals, the intermediate signals each having a state; and
    a single ended domino compatible dual function generator to receive the intermediate signals and provide an out signal and an out* signal each having a state, wherein the out and out* signals have the same state during a precharge phase and have complementary states during an evaluate phase as a function of the states of the intermediate signals and wherein the generator includes an intermittent positive feedback loop which is intermittently enabled.

11. A domino logic gate circuit, comprising:
    a combined domino stage and dual function generator in which the domino stage is to receive a domino stage input signal and the dual function generator is a single ended domino compatible dual function generator to provide an out signal and an out* signal that each have a state and during a precharge phase, the out signal and out* signal each have the same state, and during an evaluate phase the out and out* states are complementary states as a function of the domino stage input signal, wherein the generator includes a sense amplifier coupled between nodes carrying the out and out* signals.

12. The domino gate logic circuit of claim 11, wherein the generator includes a positive feedback loop.

13. The domino gate logic circuit of claim 12, wherein the loop includes cross-coupled inverters.

14. The domino gate logic circuit of claim 11, wherein the generator includes skewed cross-coupled inverters.

15. The domino gate logic circuit of claim 11, wherein the generator includes skewed transistors.

16. The domino logic gate circuit of claim 11, wherein during the precharge phase, the out signal and out* signal each have the same state, and during the evaluate phase the out and out* states are complementary states as a function of the domino stage input signal without a logic X circuit and a logic X* circuit.

17. An integrated circuit comprising:
    first and second domino stages to receive first and second domino stage input signals and provide first and second single ended intermediate signal as a function of the first and second domino stage input signals, respectively, the intermediate signals each having a state; and
    first and second single ended domino compatible dual function generators to receive the first and second intermediate signals, respectively, and provide first and second out signals and first and second out* signal, respectively, each having a state, wherein the first and second out and out* signals have the same state during a precharge phase and have complementary states during an evaluate phase as a function of the states of the intermediate signals, wherein the first out signal is part of the second domino stage input signal and wherein the generators each include an intermittent positive feedback loop which is intermittently enabled.

18. A domino logic gate circuit, comprising:
    a combined domino stage and dual function generator in which the domino stage is to receive a domino stage input signal and the dual function generator is a single ended domino compatible dual function generator to provide an out signal and an out* signal that each have a state and during a precharge phase, the out signal and out* signal each have the same state, and during an evaluate phase the out and out* states are complementary states as a function of the domino stage input signal, wherein the generator includes a transmission gate coupled between nodes carrying the out and out* signals.

19. The domino logic gate circuit of claim 18, wherein during the precharge phase, the out signal and out* signal each have the same state, and during the evaluate phase the out and out* states are complementary states as a function of the domino stage input signal without a logic X circuit and a logic X* circuit.

20. A domino logic gate circuit, comprising:
    a domino stage to receive a domino stage input signal and provide a single ended intermediate signal as a function of the domino stage input signal, the intermediate signal having a state; and a single ended domino compatible dual function generator to receive the intermediate signal and provide an out signal and an out* signal each having a state, wherein the out and out* signals have the same state during a precharge phase and have complementary states during an evaluate phase as a function of the state of the intermediate signal, wherein the domino stage is a source follower domino stage.

21. The domino gate logic circuit of claim 20, wherein the generator includes an intermittent positive feedback loop.

* * * * *